US006809540B2

(12) United States Patent
Beech

(10) Patent No.: US 6,809,540 B2
(45) Date of Patent: Oct. 26, 2004

(54) INTEGRATED CIRCUIT TEST STRUCTURE

(75) Inventor: Clive David Beech, Plymouth (GB)

(73) Assignee: Zarlink Semiconductor Limited (GB)

( * ) Notice: Subject to any disclaimer, the term of this patent is extended or adjusted under 35 U.S.C. 154(b) by 124 days.

(21) Appl. No.: 10/013,880

(22) Filed: Dec. 11, 2001

(65) Prior Publication Data

US 2002/0079883 A1 Jun. 27, 2002

(30) Foreign Application Priority Data

Dec. 13, 2000 (GB) ................................................ 0030346

(51) Int. Cl.[7] .......................... G01R 31/02; G01R 31/26
(52) U.S. Cl. ....................... 324/763; 324/537; 324/765; 438/14; 257/48
(58) Field of Search ................................ 324/763, 754, 324/765, 133, 158.1, 73.1, 755; 257/40, 48; 438/14–19, 10; 714/724–725, 736

(56) References Cited

U.S. PATENT DOCUMENTS

| 3,761,787 | A | * | 9/1973 | Davis et al. ................. 330/252 |
| 4,060,715 | A | * | 11/1977 | Scott ........................... 702/133 |
| 4,295,182 | A | * | 10/1981 | Aubusson et al. ........... 361/683 |
| 4,725,773 | A | | 2/1988 | Lieneweg |
| 4,835,466 | A | * | 5/1989 | Maly et al. .................. 324/437 |
| 4,855,253 | A | | 8/1989 | Weber |
| 4,896,108 | A | * | 1/1990 | Lynch et al. ................. 324/765 |
| 4,961,053 | A | * | 10/1990 | Krug ........................... 324/537 |
| 5,438,270 | A | * | 8/1995 | Harper et al. ................ 324/429 |
| 5,485,095 | A | | 1/1996 | Bertsch et al. |
| 5,514,974 | A | * | 5/1996 | Bouldin ....................... 324/763 |
| 5,517,107 | A | * | 5/1996 | Ovens et al. ............. 324/158.1 |
| 5,614,857 | A | * | 3/1997 | Lim et al. .................... 327/205 |
| 5,631,596 | A | | 5/1997 | Sporck et al. |
| 5,670,883 | A | * | 9/1997 | O'Donoghue et al. ....... 324/437 |
| 5,898,228 | A | | 4/1999 | Sugasawara |
| 5,909,034 | A | * | 6/1999 | Soldavini et al. .............. 257/48 |
| 5,962,868 | A | * | 10/1999 | Tanida .......................... 257/48 |
| 6,175,125 | B1 | * | 1/2001 | Tsai ............................. 257/48 |
| 6,232,618 | B1 | * | 5/2001 | Wienand et al. ............... 257/48 |
| 6,281,696 | B1 | * | 8/2001 | Voogel ......................... 324/765 |
| 6,503,765 | B1 | * | 1/2003 | Chao et al. .................... 438/14 |

FOREIGN PATENT DOCUMENTS

| DE | 10026747 | 1/2001 |
| EP | 0288804 | 11/1988 |
| JP | 06216134 | 8/1994 |
| JP | 07106385 | 4/1995 |

* cited by examiner

Primary Examiner—Kamand Cuneo
Assistant Examiner—Paresh Patel
(74) Attorney, Agent, or Firm—Thompson Hine LLP

(57) ABSTRACT

An integrated circuit test structure comprises a potential divider and an array of test circuits. Each test circuit comprises series-connected chains of integrated circuit connections between test voltage lines. Each test circuit also comprises a comparator in the form of a MOSFET having a gate connected to the center point of the chains and a source connected to the output of the potential divider. The drain of the transistor is connected to an input for a bias voltage.

20 Claims, 3 Drawing Sheets

INTEGRATED CIRCUIT TEST STRUCTURE

This application claims priority to UK application 0030346.1, filed Dec. 13, 2000.

BACKGROUND OF THE INVENTION

1. Field of the Invention

The present invention relates to an integrated circuit test structure. Such a test structure may be formed together with production integrated circuits on a common wafer which is divided in the usual way into individual integrated circuits with the test structure being available for testing so as to reveal any process induced defects.

2. Description of the Prior Art

As the density of integration and the size of integrated circuits increases, it becomes increasingly important to minimise the process induced defects. This is particularly so for defects associated with connections, such as contacts, vias, and portions of interconnecting layers and diffusions.

It is often very difficult to locate an open circuit fault in an integrated circuit. Techniques such as thermal imaging are of no use because an open circuit does not dissipate energy and so is not visible on a thermal image. In order to study open circuit defects, it is necessary to process representative silicon wafers on which are formed test structures. However, a typical very large scale integrated circuit may have as many as ten million contacts and six million vias and this is difficult to replicate on a practical test structure.

A requirement of a representative test structure is that it should be possible to test the structure in a reasonable time while retaining some ability to locate any defect. A single test structure containing ten million contacts in series would typically have a total resistance of 150 MΩ. When tested with a typical test voltage of 2 volts, such a structure would pass a current less than 20 nA, which is so small that it would be difficult to detect whether the structure were faulty. Conversely, an array of one thousand contacts would pass a current in excess of 100 µA and any failure would be easily detected. However, ten thousand such arrays would be needed to replicate ten million "cells" and the typical time for testing such a structure would be about 30 minutes plus the time required to perform probe stepping.

SUMMARY OF THE INVENTION

According to the present invention, there is provided an integrated circuit test structure comprising a potential divider and at least one test circuit comprising: first and second connection chains connected in series and each comprising a plurality of integrated circuit connections connected in series; and a comparator having a first input connected to the connection between the first and second chains and a second input connected to the output of the potential divider.

The test structure may be formed on a wafer on which are formed production integrated circuits having connections of the same type as the connections of the first and second chains.

Each of the first and second chains may comprise at least one contact and/or at least one via and/or at least one portion of an interconnecting layer and/or at least one portion of an interconnection diffusion.

The potential divider and the series-connected first and second chains may be connected between first and second test voltage inputs.

The potential divider may comprise first and second resistances connected in series. The first and second resistances may have substantially the same value and the first and second chains of the or each test circuit may have substantially the same resistance. The values of the first and second resistances may be less than the resistances of the first and second chains of the or each test circuit.

The test structure may comprise a plurality of test circuits arranged as an array on a substrate. The comparators of each row may be connected to a row access input. The comparators of each column may be connected to a column access input.

The comparator of the or each test circuit may comprise a transistor. The transistor may be a field effect transistor. The transistor may be a metal oxide silicon field effect transistor. The transistor may have a gate constituting the first input and a source constituting the second input. The drains of the transistors of each column may be connected to the column access input. Each of the transistors of each row may have a further gate connected to the row access input.

It is thus possible to provide an integrated circuit test structure having a relatively simply layout and able to provide a relatively high measurement current in the case of a failure or defect, in particular of the open circuit type. The structure allows relatively fast testing. For example, in the case of an array of test circuits, the whole structure may be initially tested and, if a defect is found, the individual test circuits may then be tested. In the absence of a defect, the test time may be less than one second whereas, for a typical structure having about ten million connections, the total test time including locating the circuit containing the defect may be of the order of half a minute. A moderate level of defect location detection can be provided such that physical or "visual" inspection is then viable, for example using a scanning electron microscope.

BRIEF DESCRIPTION OF THE DRAWINGS

The invention will be further described, by way of example, with reference to the accompanying drawings, in which.

DESCRIPTION OF THE PREFERRED EMBODIMENT

Figure 1:
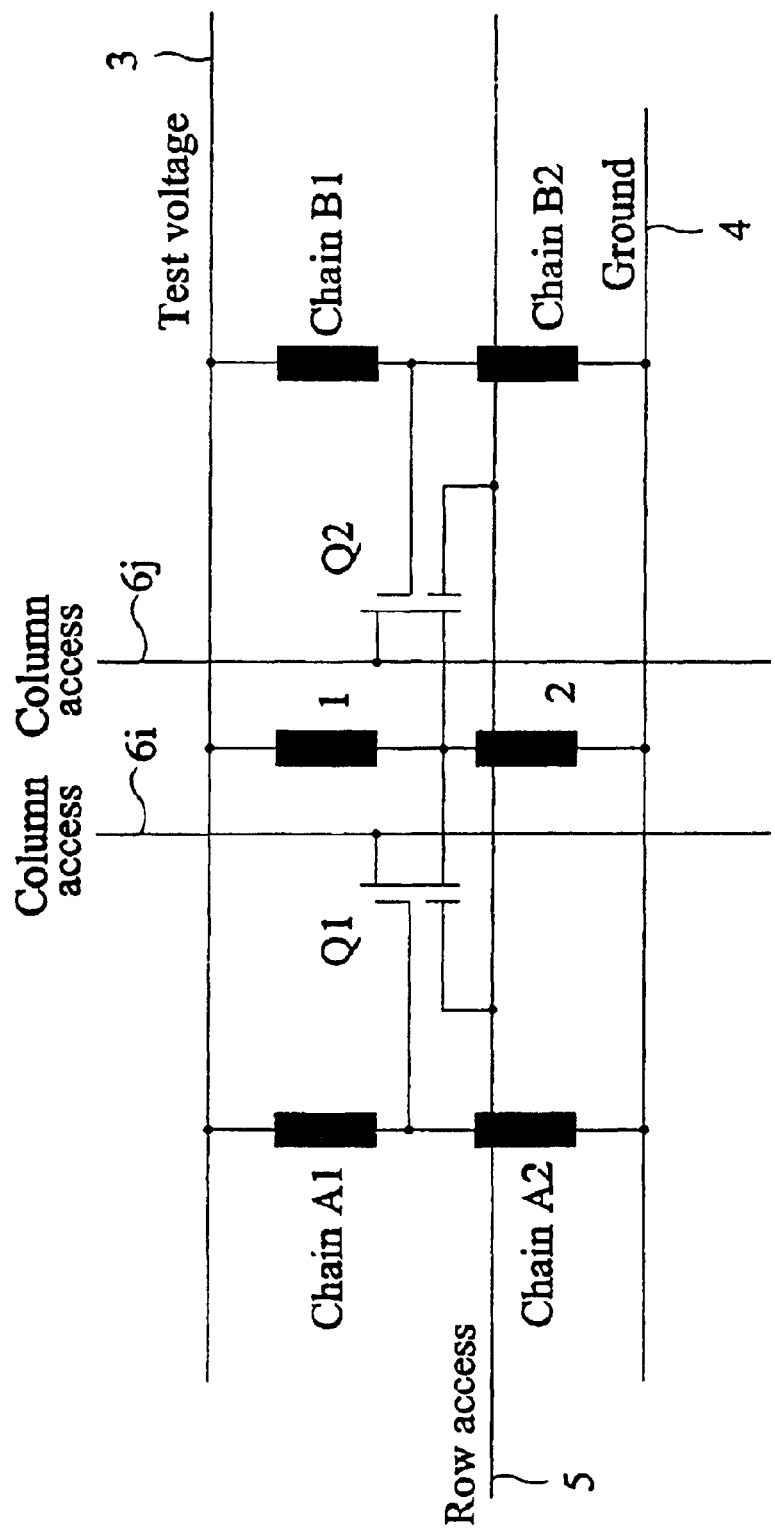
FIG. 1 is a schematic circuit diagram illustrating part of an integrated circuit test structure constituting an embodiment of the invention.

FIG. 1 illustrates part of an integrated circuit test structure comprising two test circuits and the connections thereto. Each test circuit comprises a comparator in the form of a dual gate metal oxide silicon field effect transistor Q1, Q2 (or two single gate transistors with their source-drain paths connected in series; both arrangements are electrically equivalent to each other). The sources of the transistors Q1 and Q2 are connected to the output of a potential divider comprising resistances 1 and 2 which are connected in series between test voltage lines or inputs 3 and 4. The resistors 1 and 2 are of substantially identical relatively low value, for example 1 kΩ, and are formed by physically identical structures on the integrated circuit substrate. The resistors 1 and 2 are designed to be highly reliable, for example by using moderately wide tracks of conductive material, such as metal or polycrystalline silicon.

A first gate of the transistor Q1 is connected to the connection between chains A1 and A2 of integrated circuit connections, which chains are connected in series between the test voltage inputs 3 and 4. Similarly, the first gate of the transistor Q2 is connected to series-connected chains B1 and B2 of integrated circuit connections. Each of the chains comprises, for example, about five thousand contacts connected in series. The contacts are of a type and arrangement for resembling the contacts in a production integrated circuit i.e. an integrated circuit intended for actual use, formed by the same processing method or on the same silicon wafer as the test structure. Thus, each chain A1, A2, B1, B2 may comprise any combination of, for example, contacts, vias and portions or lengths of interconnecting layers and diffusions.

Second gates of the transistors Q1 and Q2 are connected to a row access line or input 5 which is common to the transistors of a row. The two test circuits shown in FIG. 1 are in adjacent columns and the drains of the transistors Q1 and Q2 are connected to respective column access lines or inputs $6_i$, $6_j$.

Figure 2:
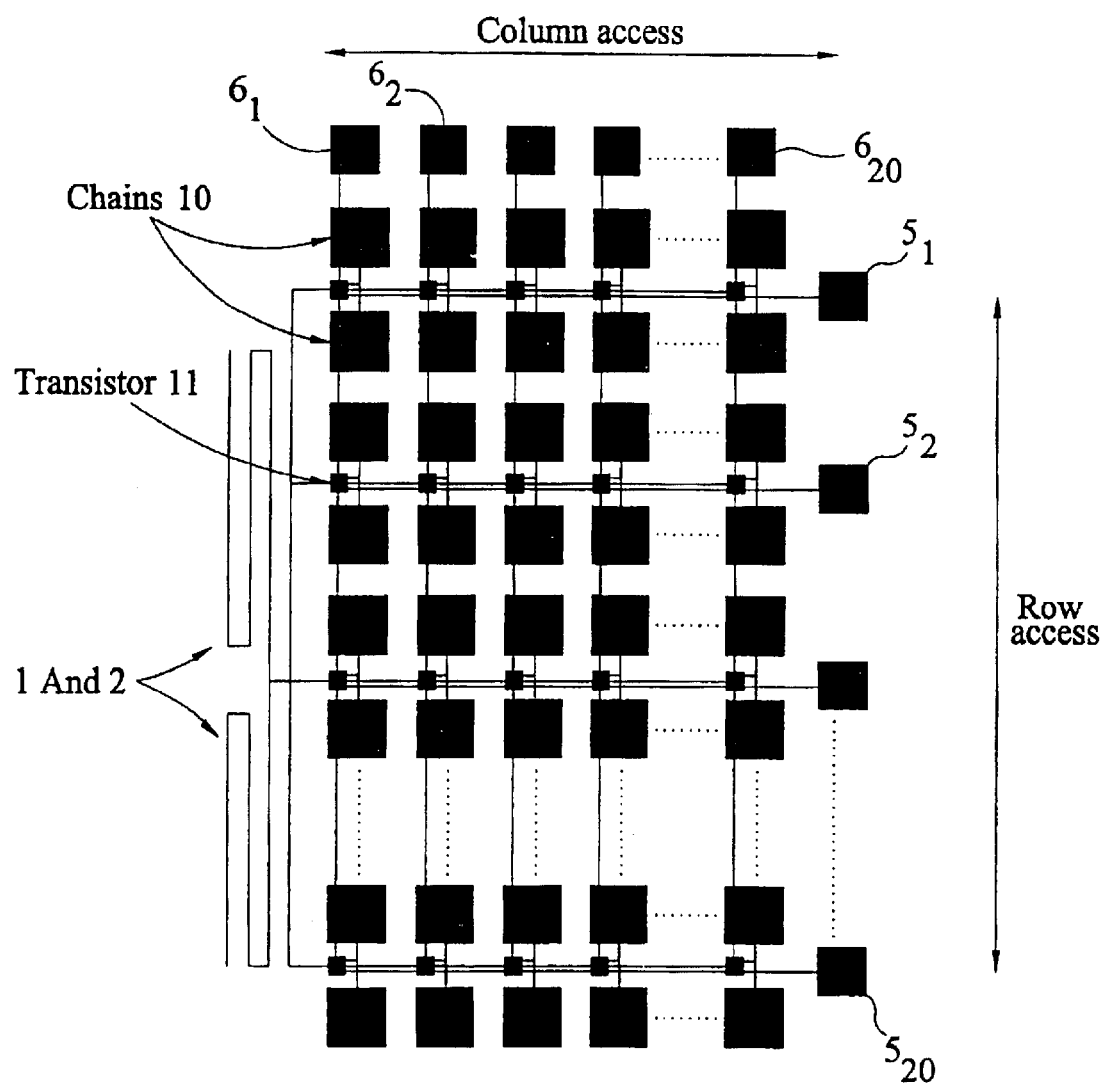
FIG. 2 is a diagram illustrating the layout of the structure illustrated in FIG. 1.

As shown in FIG. 2, the test circuits including the connection chains 10 and the transistors 11 are formed as an array of rows and columns with typically 20 rows and 20 columns so as to provide a structure having about two million connections in the chains 10. The resistances 1 and 2 are common to all of the test circuits. The area occupied by the test structure is similar to that occupied by a production integrated circuit and the types of connections and processes involved in forming them are substantially identical to the production integrated circuits formed on the same silicon wafer. As shown in FIG. 2, the drains of the transistors 11 in each column are connected together and to a respective column access input $6_1$, $6_2$, ..., $6_{20}$. Similarly, the second gates of the transistors 11 in each row are connected together and to a respective row access input $5_1$, $5_2$, ..., $5_{20}$.

Figure 3:
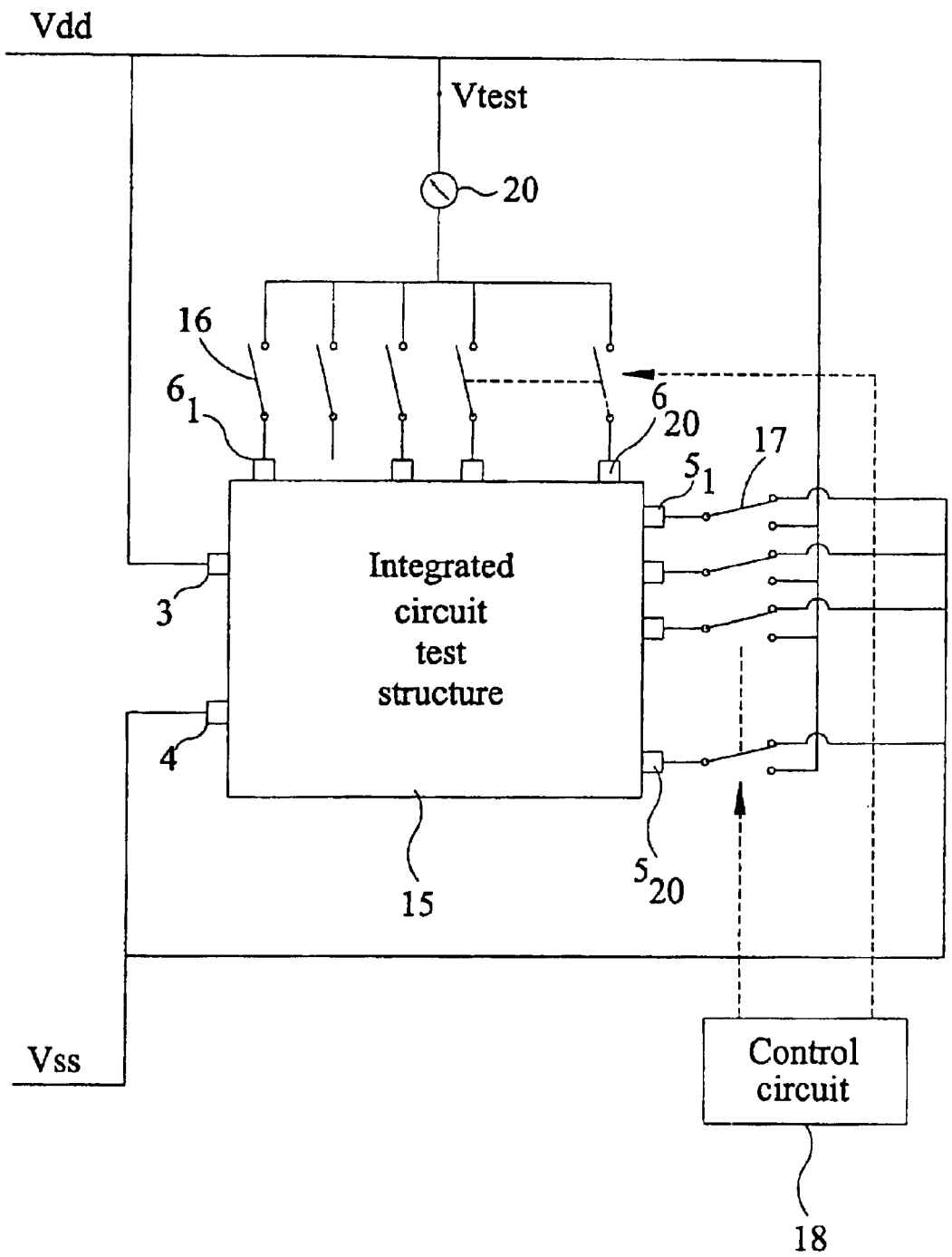
FIG. 3 is a block schematic diagram illustrating testing of the test structure illustrated in FIGS. 1 and 2.

FIG. 3 illustrates the integrated circuit test structure 15 as shown in FIGS. 1 and 2 being tested. The row and column access inputs $5_1$–$5_{20}$, $6_1$–$6_{20}$ are connected to respective electronic switches such as 16 and 17, which are individually controllable by a control circuit 18. The test voltage inputs 3 and 4 are connected to positive and negative supply lines Vdd and Vss to receive a test voltage, typically of about 2 volts. The row access inputs $5_1$–$5_{20}$ are individually connectable via the switches 17 to receive an enabling voltage which is shown as being the positive supply line Vdd in FIG. 3. The column access inputs $6_1$–$6_{20}$ are individually connectable via a current measuring arrangement 20 to a suitable vias voltage source, which is illustrated in FIG. 3 as being the positive supply line Vdd.

The integrated test structure 15 is processed with the other production integrated circuits on the same wafer in accordance with all the fabrication steps necessary to produce the finished integrated circuits. The test structure 15 is then connected to the test arrangement shown in FIG. 3. Initially, the control circuit 18 switches on all of the electronic switches 16 and 17 so that the column access inputs $6_1$–$6_{20}$ are connected together and through the current measuring arrangement 20 to a test voltage V test (illustrated by way of example only as the positive supply line Vdd). Likewise, the switches 17 switch the row access inputs $5_1$–$5_{20}$ between the positive and negative supply lines Vdd and Vss.

As shown in FIG. 1, each transistor such as Q1 constitutes a comparator which compares the voltage supplied by the potential divider, which voltage is substantially half the test voltage, with the voltage at the connection between the two connection chains of the test circuit. The column access input provides a suitable bias or supply voltage to the drain of the transistor whereas the row access input enables the transistor. If the connection chain A2 is open circuit, the voltage on the first gate of the transistor Q1 is close to the positive test voltage so that the transistor Q1 is switched on and current flows through the source-drain path and through the lower resistance 2 of the potential divider. However, if there is no open circuit fault in either of the chains A1 and A2, the transistor Q1 remains switched off and no substantial current flows through its source-drain path. Only the lower chain A2 can be tested in this way, but an equivalent test can be performed on the upper chain A1 by repeating the test with the structure electrically inverted.

The initial test may be performed in about half a second. If the current measuring device 20 does not measure any source-drain current indicative of a defect, the test is successfully completed. However, if the arrangement 20 detects a current flow indicative of a defect, then the test circuit containing a defective chain can be located. This may be done by switching off all of the switches 16 and then switching on each switch 16 in turn with all of the rows enabled. This allows the column containing the faulty connection chain to be located. The switch 16 for the defective column may then remain on and the switches 17 may be switched off and then each switch turned on in turn so as to locate the row of the defective chain. All locations can thus be checked in a total test time of approximately 25 seconds for a structure having of the order of 1 to 10 million connections.

In the present example where each connection chain comprises five thousand individual connections, each such chain occupies an area of approximately 100×100 μm. Such a chain can conveniently be examined, for example using a scanning electron microscope, and there would be an acceptable likelihood of finding a defect of the type providing visual evidence.

What is claimed is:

1. A non-commercial integrated circuit test structure for testing a plurality of integrated circuit interconnections for an open circuit, said structure comprising a potential divider providing an output, and at least one test circuit, the at least one test circuit comprising first and second chains connected in series at a circuit node, each of said first and second chains exclusively comprising a plurality of said integrated circuit interconnections connected in series, and a comparator having a first input connected to said circuit node and a second input connected to said output of said potential divider.

2. A test structure as claimed in claim 1, formed on a wafer on which are formed commercial integrated circuits having interconnections of a same type as said interconnections of said first and second chains.

3. A test structure as claimed in claim 1, in which each of said first and second chains comprises at least one contact.

4. A test structure as claimed in claim 1, in which each of said first and second chains comprises at least one via.

5. A test structure as claimed in claim 1, in which each of said first and second chains comprises at least one portion of an interconnecting layer.

6. A test structure as claimed in claim 1, in which each of said first and second chains comprises at least one portion of an interconnection diffusion.

7. A test structure as claimed in claim 1, comprising first and second test voltage inputs, said potential divider and said series-connected first and second chains being connected between said first and second test voltage inputs.

8. A test structure as claimed in claim 1, in which said potential divider comprises first and second resistances connected in series.

9. A test structure as claimed in claim 8, in which said first and second resistances have substantially equal values and said first and second chains have substantially equal resistances.

10. A test structure as claimed in claim 9, in which said equal values are less than said equal resistances.

11. A test structure as claimed in claim 1, comprising a plurality said test circuits arranged as an array on a substrate.

12. A test structure as claimed in claim 11, in which said array comprises rows, each row having multiple test circuit comparators, each row having a corresponding row access input, and said multiple test circuit comparators of a given row are connected to the corresponding row access input of the given row.

13. A test structure as claimed in claim 11, in which said array comprises columns, each column having multiple test circuit comparators, each column having a corresponding column access input, and said multiple test circuit comparators of a given column are connected to the corresponding column access input of the given column.

14. A test structure as claimed in claim 1, in which said comparator comprises a transistor.

15. A test structure as claimed in claim 14, in which said transistor is a field effect transistor.

16. A test structure as claimed in claim 15, in which said transistor is a metal oxide silicon field effect transistor.

17. A test structure as claimed in claim 15, in which said transistor has a gate constituting said first input and a source constituting said second input.

18. A test structure as claimed in claim 15, comprising a plurality of said test circuits arranged as an array on a substrate.

19. A test structure as claimed in claim 18, in which said array comprises columns, each column having multiple test circuit transistors with respective drains, each column having a corresponding column access input, and said drains of said multiple test circuit transistors of a given column are connected to the corresponding column access input of the given column.

20. A test structure as claimed in claim 18, in which said array comprises rows, each row having multiple test circuit transistors with respective drains, each row having a corresponding row access input, and said drains of said multiple test circuit transistors of a given row are connected to the corresponding row access input of the given row.

* * * * *